US012622201B2

(12) United States Patent (10) Patent No.: US 12,622,201 B2

Sato (45) Date of Patent: May 5, 2026

(54) SUBSTRATE PROCESSING APPARATUS AND SUBSTRATE PROCESSING METHOD

(71) Applicant: TOKYO ELECTRON LIMITED, Tokyo (JP)

(72) Inventor: Yoshitomo Sato, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 65 days.

(21) Appl. No.: 18/671,903

(22) Filed: May 22, 2024

(65) Prior Publication Data

US 2024/0395570 A1 Nov. 28, 2024

(30) Foreign Application Priority Data

May 23, 2023 (JP) ................................. 2023-084822

(51) Int. Cl.
*H10P 70/00* (2026.01)
*A46B 13/02* (2006.01)
(Continued)

(52) U.S. Cl.
CPC .......... *H10P 72/0406* (2026.01); *A46B 13/02* (2013.01); *B08B 1/12* (2024.01);
(Continued)

(58) Field of Classification Search
None
See application file for complete search history.

(56) References Cited

U.S. PATENT DOCUMENTS

| 7,012,684 B1 * | 3/2006 | Hunter | ............... G01N 21/9501 |
| | | | 250/559.44 |
| 2014/0199635 A1 * | 7/2014 | Hirano | .............. H01L 21/67288 |
| | | | 279/142 |

(Continued)

FOREIGN PATENT DOCUMENTS

| JP | H08318226 | * 12/1996 |
| JP | 2013-21026 A | 1/2013 |

(Continued)

OTHER PUBLICATIONS

Translation of JPH08318226 by Sato, published Dec. 3, 1996.*

*Primary Examiner* — Kaj K Olsen
(74) *Attorney, Agent, or Firm* — Nath, Goldberg & Meyer; Jerald L. Meyer; Tanya E. Harkins

(57) ABSTRACT

A substrate processing apparatus includes: a brush processing section configured to perform brush processing on a surface of a substrate taken out from a container; a substrate reversal section configured to flip the substrate before the brush processing and after the brush processing; a substrate imaging section configured to perform pre-processing imaging on the surface before the brush processing, and perform post-processing imaging on the surface after the brush processing and before the substrate is returned to the container; and a controller, wherein the controller determines whether or not the substrate after the brush processing is a good product based on a result of the post-processing imaging, and changes, as necessary, a process condition of the brush processing for the substrate having been subjected to the pre-processing imaging or a substrate to be processed afterward based on at least one of the pre-processing imaging or the post-processing imaging.

14 Claims, 10 Drawing Sheets

(51) Int. Cl.
  B08B 1/12 (2024.01)
  B08B 1/20 (2024.01)
  B08B 1/32 (2024.01)
  H10P 72/00 (2026.01)

(52) U.S. Cl.
  CPC .................. B08B 1/20 (2024.01); B08B 1/32 (2024.01); H10P 72/0412 (2026.01); H10P 72/0616 (2026.01); *A46B 2200/3073* (2013.01)

(56) References Cited

U.S. PATENT DOCUMENTS

| | | | | |
|---|---|---|---|---|
| 2016/0315002 | A1* | 10/2016 | Komatsu | B24B 37/0053 |
| 2018/0315622 | A1* | 11/2018 | Kobayashi | H01L 21/67046 |
| 2022/0308464 | A1* | 9/2022 | Liu | G03F 7/70925 |

FOREIGN PATENT DOCUMENTS

| | | | |
|---|---|---|---|
| JP | 2013-137292 | A | 7/2013 |
| JP | 2014-109436 | A | 6/2014 |
| JP | 2014-115140 | A | 6/2014 |
| JP | 2015-215193 | A | 12/2015 |
| JP | 2016-157841 | A | 9/2016 |
| JP | 2018-56574 | A | 4/2018 |

* cited by examiner

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2023-084822, filed on May 23, 2023, the entire contents of which are incorporated herein by reference.

TECHNICAL FIELD

The present disclosure relates to a substrate processing apparatus and a substrate processing method.

BACKGROUND

In manufacturing semiconductor devices, for the purpose of addressing defocus issues and the like during an exposure process, brush cleaning is performed to remove foreign substances adhering to a back surface (surface where devices are not formed) of a substrate such as a semiconductor wafer. Patent Document 1 discloses an apparatus for performing such brush cleaning.

PRIOR ART DOCUMENTS

Patent Documents

Patent Document 1: Japanese Patent Laid-open Publication No. 2013-21026

SUMMARY

According to one embodiment of the present disclosure, a substrate processing apparatus includes: a container loading/unloading section on which a container, which accommodates a plurality of substrates each with a first surface facing upward and a second surface facing downward, is placed; a brush processing section configured to perform brush processing for polishing or removing foreign substances on the second surface of each of the substrates by using a brush; a substrate reversal section configured to flip a substrate that is taken out from the container, among the plurality of substrates, to face the second surface upward before the substrate is processed in the brush processing section, and configured to flip the substrate to face the first surface upward after the substrate is processed in the brush processing section and before the substrate is returned to the container; a substrate imaging section configured to perform pre-processing imaging on the second surface of the substrate that is taken out from the container before the substrate is processed in the brush processing section, and configured to perform post-processing imaging on the second surface of the substrate after the substrate is processed in the brush processing section and before the substrate is returned to the container; and a controller, wherein the controller is configured to determine whether or not the substrate after the brush processing is a good product based on a result of the post-processing imaging, and further configured to change, as necessary, a process condition of the brush processing in the brush processing section for the substrate having been subjected to the pre-processing imaging or a substrate to be processed afterward based on at least one of the pre-processing imaging or the post-processing imaging.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a schematic longitudinal-sectional view of the substrate processing system illustrated in FIG. 1.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, configurations of a substrate processing system according to embodiments of a substrate processing apparatus will be described with reference to the accompanying drawings. To facilitate description of directions, an XYZ Cartesian coordinate system is established (see the bottom left of FIG. 1).

Figure 1:
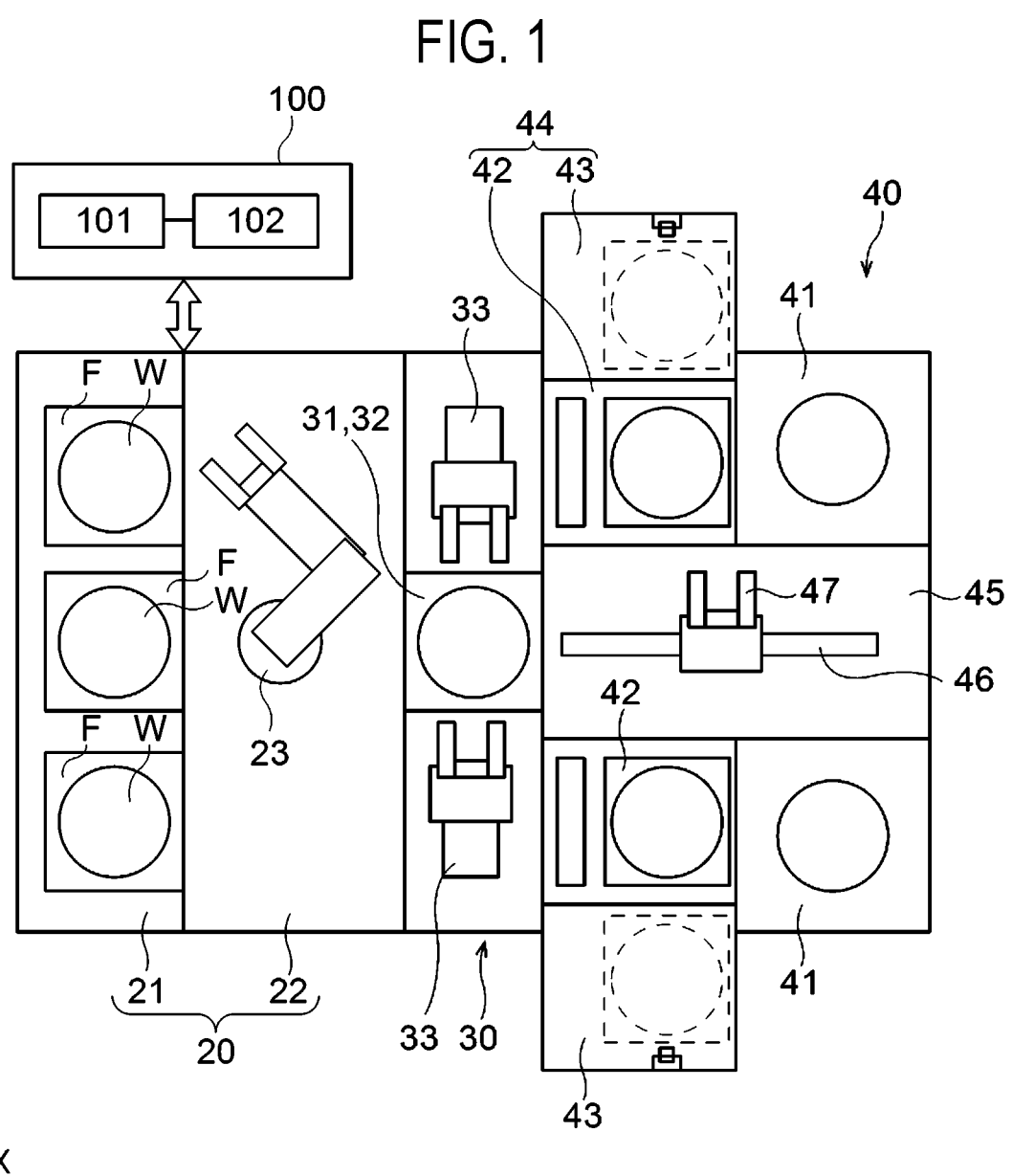
FIG. 1 is a schematic cross-sectional view of a substrate processing system according to a first embodiment of a substrate processing apparatus.
Figure 2:
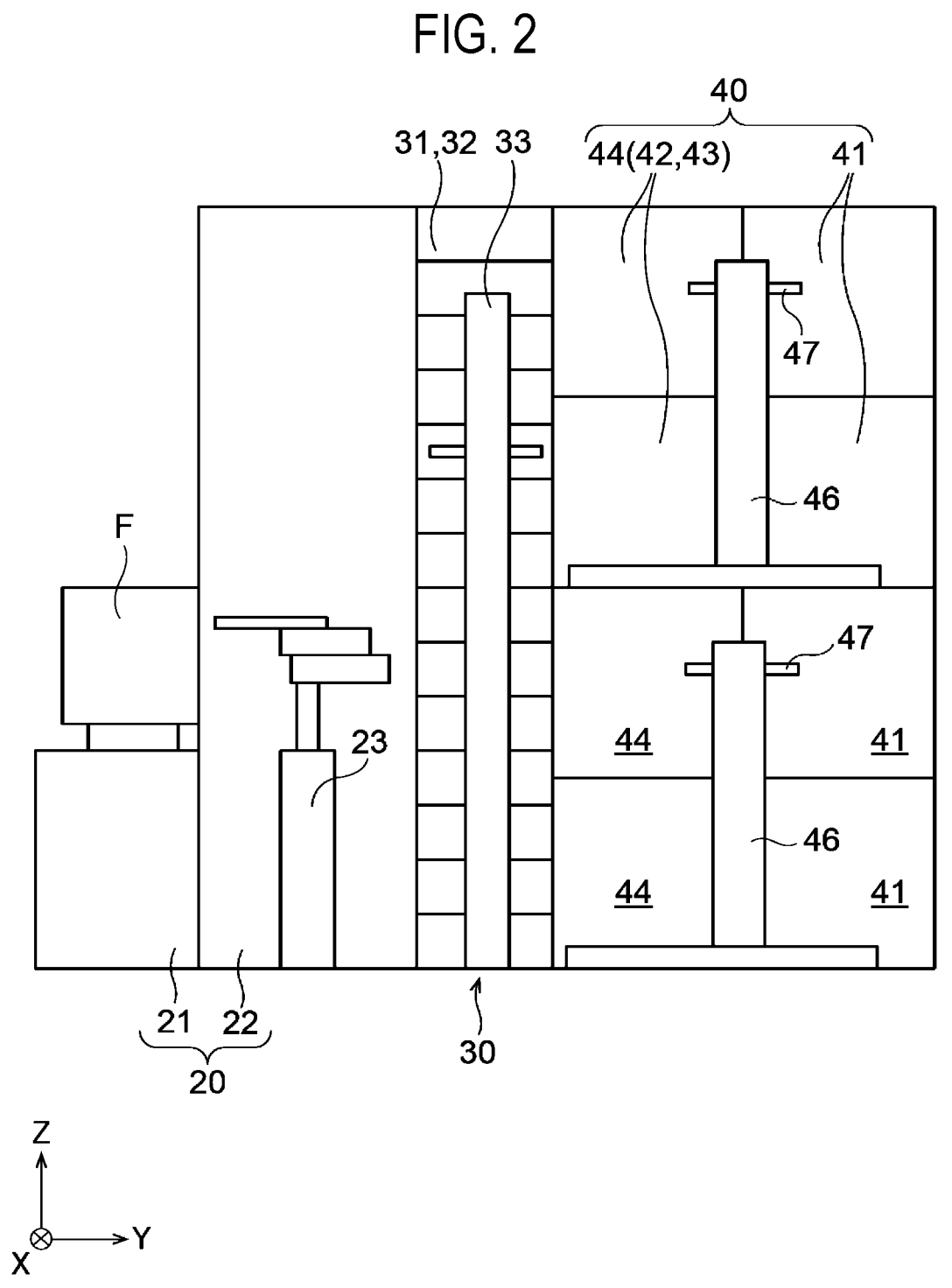

FIGS. 1 and 2 illustrate an overall configuration of a substrate processing system 1 according to a first embodiment.

The substrate processing system 1 includes a substrate loading/unloading block 20, an interface block 30, and a process block 40.

The substrate loading/unloading block 20 includes a stage section (container loading/unloading section) 21 and a first transfer section 22. A plurality of substrate transfer containers F (e.g., FOUPs), which is loaded from the outside of the substrate processing system 1, can be placed on the stage section 21. Each substrate transfer container F (hereinafter simply referred to as "container F") has a plurality of slots provided at equal intervals in a vertical direction, and each slot accommodates one sheet of wafer W (substrate) in a horizontal posture.

A first transfer robot 23 is provided in the first transfer section 22. The first transfer robot 23 may have any configuration as long as it can perform a transfer operation to be described later. For example, the first transfer robot 23 may be configured by a multi-axis horizontal articulated robot with a lifting function. The first transfer robot 23 has, for example, a two-pronged fork-shaped substrate gripping arm as an end effector. Using this substrate gripping arm, the first transfer robot 23 can load and unload the wafer W with respect to any slot of any substrate transfer container F placed on the stage section 21.

A plurality of (e.g., eight) buffer units 31 and a plurality of (e.g., eight) delivery units 32, which are stacked in the vertical direction, are provided in the interface block 30. The buffer units 31 are provided at height positions accessible by the first transfer robot 23.

The buffer units 31 are used to temporarily store the wafer W. The delivery units 32 are used to temporarily store the wafer W to deliver the wafer W between transfer robots (vertical transfer robots 33 and second transfer robots 46, which will be described later). Each of the buffer units 31 and each of the delivery units 32 may be classified as a unit for placing therein a wafer before processing or a unit for placing therein a wafer after processing.

In addition, one or more vertical transfer robots 33 are provided in the interface block 30. In the illustrated example, one vertical transfer robot 33 is provided on each of both sides of the stacked structure in which the buffer units 31 and delivery units 32 are stacked. The vertical transfer robot 33 has a lifting body, which is movable in a Z direction, and a substrate gripping arm as an end effector, which is provided on the lifting body and is movable back and forth in a Y direction. By using the substrate gripping arm, the vertical transfer robot 33 can load and unload the wafer W with respect to any buffer unit 31 and any delivery unit 32.

The process block 40 includes a plurality of (e.g., eight) brush cleaning units (brush processing sections) 41, a plurality of (e.g., eight) reversal units (substrate reversal sections) 42, a plurality of, for example, eight imaging units (substrate imaging sections) 43, and a second transfer section 45. One or more (here, two) second transfer robots 46 are provided in the second transfer section 45.

The reversal unit 42 flips the wafer W, and is also referred to as "reverser" or the like in the field of semiconductor manufacturing equipment. The imaging unit 43 captures an image of a back surface of the wafer W by using an imaging device such as a camera or scanner to detect foreign substances, flaws, or the like on the back surface of the wafer W. In the first embodiment, one reversal unit 42 and one imaging unit 43 are integrated to constitute a single reversal/imaging composite unit 44.

In the first embodiment, four reversal/imaging composite units 44 and four brush cleaning units 41 are stacked vertically on each of both sides of the second transfer section 45. The second transfer robot 46 may have any configuration as long as it can perform a transfer operation to be described later. For example, the second transfer robot 46 may be configured by a multi-axis horizontal articulated robot with a lifting function. The second transfer robot 46 has, for example, a two-pronged fork-shaped substrate gripping arm as an end effector. By using this substrate gripping arm, the second transfer robot 46 can load and unload the wafer W with respect to any reversal/imaging composite unit 44 and any brush cleaning unit 41.

In the first embodiment, the process block 40 is divided into two layers, i.e., upper and lower layers. One of the two second transfer robots 46 transfers the wafer between the units 41 and 44 on the upper layer, while the other of the two second transfer robots 46 transfers the wafer between the units 41 and 44 on the lower layer.

In addition, the first transfer robot 23, the second transfer robot 46, and the vertical transfer robot 33 may be all well known in the field of semiconductor manufacturing equipment. Illustrations and descriptions of detailed structures for these transfer robots are omitted.

As illustrated in FIG. 1, the substrate processing system 1 includes a control device 100. The control device 100 is, for example, a computer and includes a processor 101 and a storage 102. The storage 102 stores programs (including processing recipes) that control various processes executed in the substrate processing system 1. The processor 101 controls operations of the substrate processing system 1 by reading and executing the programs stored in the storage 102.

The programs may be recorded on a non-transitory computer readable storage medium and may be installed from the storage medium into the storage 102 of the control device 100. Examples of the computer readable storage medium include a hard disk (HD), a flexible disk (FD), a compact disk (CD), a magneto-optical disk (MO), a memory card, and the like.

Next, configurations of the respective units will be described.

Figure 3:
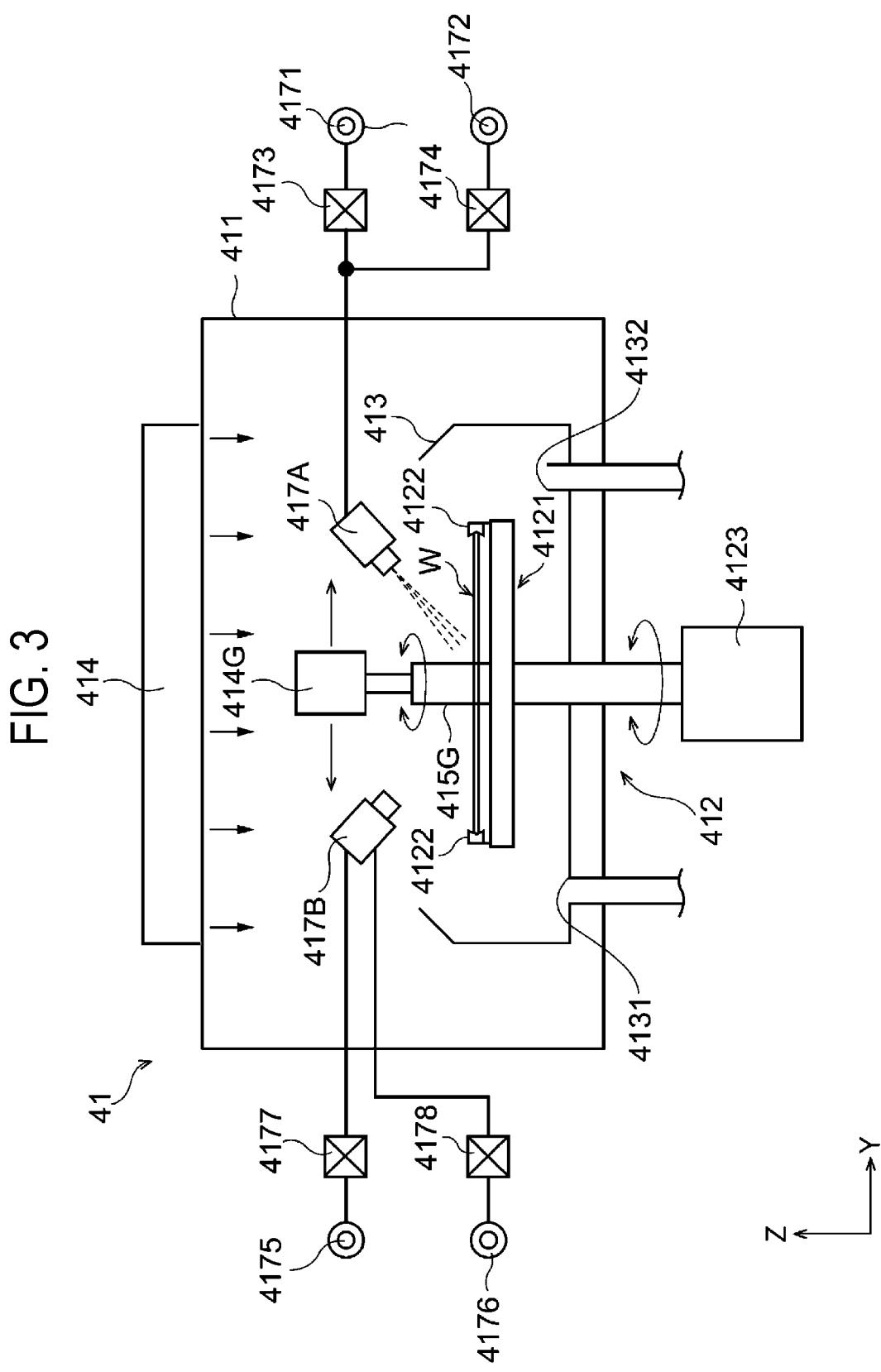
FIG. 3 is a schematic longitudinal-sectional view illustrating an exemplary configuration of a brush cleaning unit capable of being incorporated into the substrate processing system according to the first embodiment.

A configuration of the brush cleaning unit 41 will be described with reference to FIGS. 3 and 4. The brush cleaning unit 41 is also referred to as a "scrubber" or the like in the field of semiconductor manufacturing equipment. The brush cleaning unit 41 includes a housing (unit chamber) 411. A spin chuck (substrate holding rotator) 412 configured to hold and rotate the wafer W is provided inside the housing 411. A substrate holder 4121 included in the spin chuck 412 is of a type called a mechanical chuck. The substrate holder 4121 is configured to hold the wafer W in a horizontal posture by a plurality of (e.g., four) gripping hooks 4122 that grip a periphery of the wafer W. The spin chuck 412 can rotate the held wafer W around a vertical axis by a rotary drive 4123 such as an electric motor.

A liquid receiving cup 413 is provided around the spin chuck 412 to receive a liquid scattered from the rotating wafer W. An exhaust port 4131 and a drain port 4132 are provided at a bottom of the liquid receiving cup 413. The liquid received by the liquid receiving cup 413 is discharged from the liquid receiving cup 413 via the drain port 4132. By suctioning an interior of the liquid receiving cup 413 via the exhaust port 4131, a flow of clean air blown downward from a fan filter unit 414 is drawn into the liquid receiving cup 413. Thus, an airflow is generated in a vicinity of the wafer W, and liquid droplets scattered from the wafer W are prevented from being reattached to the wafer W.

Figure 4:
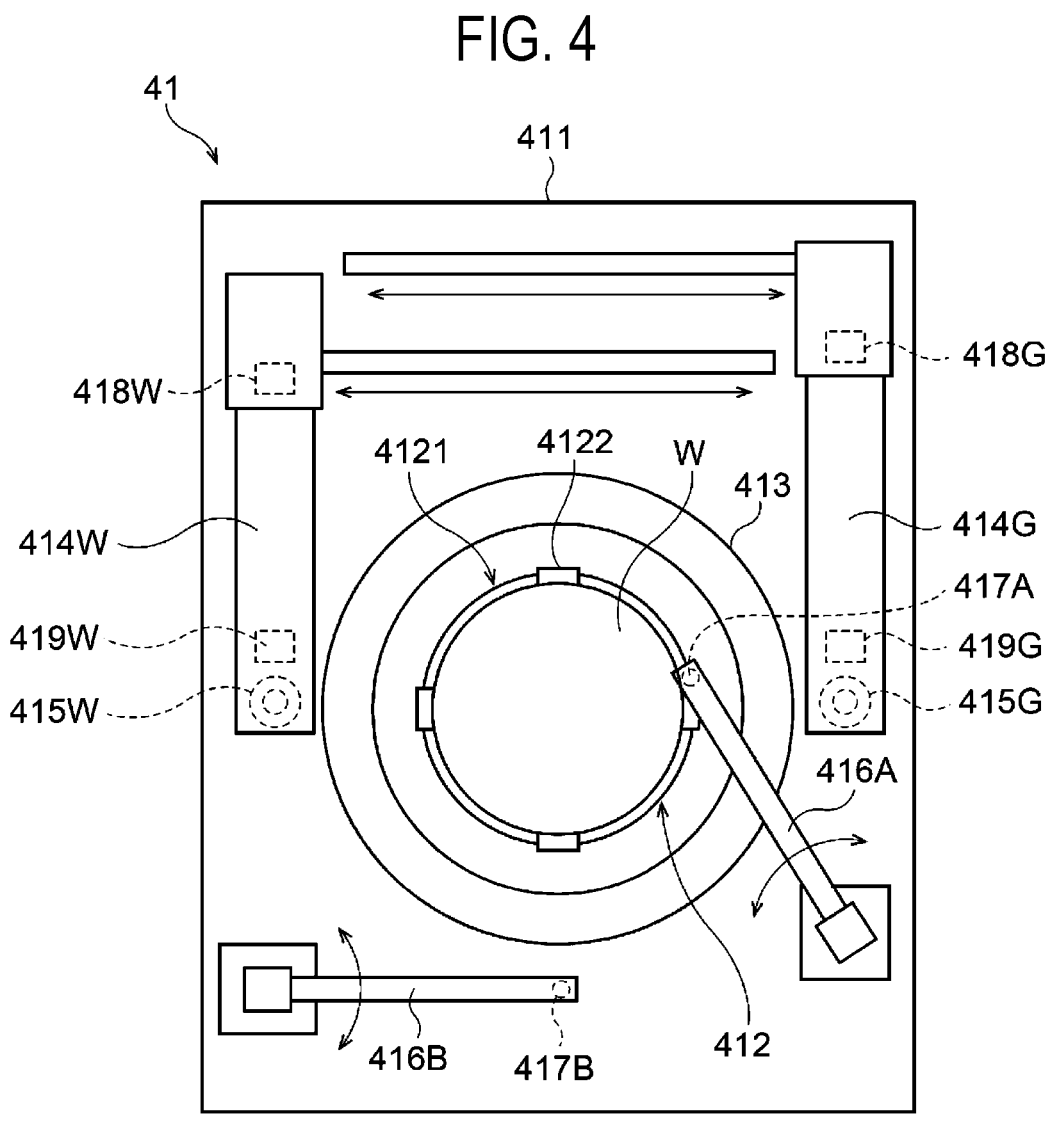
FIG. 4 is a schematic cross-sectional view of the brush cleaning unit illustrated in FIG. 3.
Figure 4:
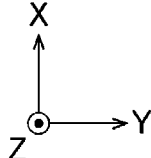

The brush cleaning unit 41 includes two brush driving arms 414G and 414W (see FIG. 4). A polishing brush 415G is held at a tip of the brush driving arm 414G, and a cleaning brush 415W is held at a tip of the brush driving arm 414W. The brush driving arms 414G and 414W can respectively move the held brushes 415G and 415W at any movement speed to any position between a home position (standby position) outside the cup 413 and a position corresponding to a center of the wafer W held by the spin chuck 412 in a plan view. In the illustrated embodiment, the brush driving arms 414G and 414W are configured to be translationally movable in the Y direction along guide rails by translation drives assigned to the brush driving arms 414G and 414W, respectively. Thus, the brushes 415G and 415W are also translationally movable in the Y direction.

Lifting mechanisms 418G and 418W (represented schematically by dashed lines) capable of raising or lowering the held brushes 415G and 415W are provided in the brush driving arms 414G and 414W, respectively. By using the lifting mechanisms 418G and 418W, the brushes 415G and 415W can be pressed against the wafer W, which is held by the spin chuck 412, with a desired pressing force.

Rotary drives 419G and 419W (represented schematically by dashed lines) are incorporated into the brush driving arms 414G and 414W, respectively. The rotary drives 419G and 419W can respectively rotate the brushes 415G and 415W at any speed.

Figure 5:
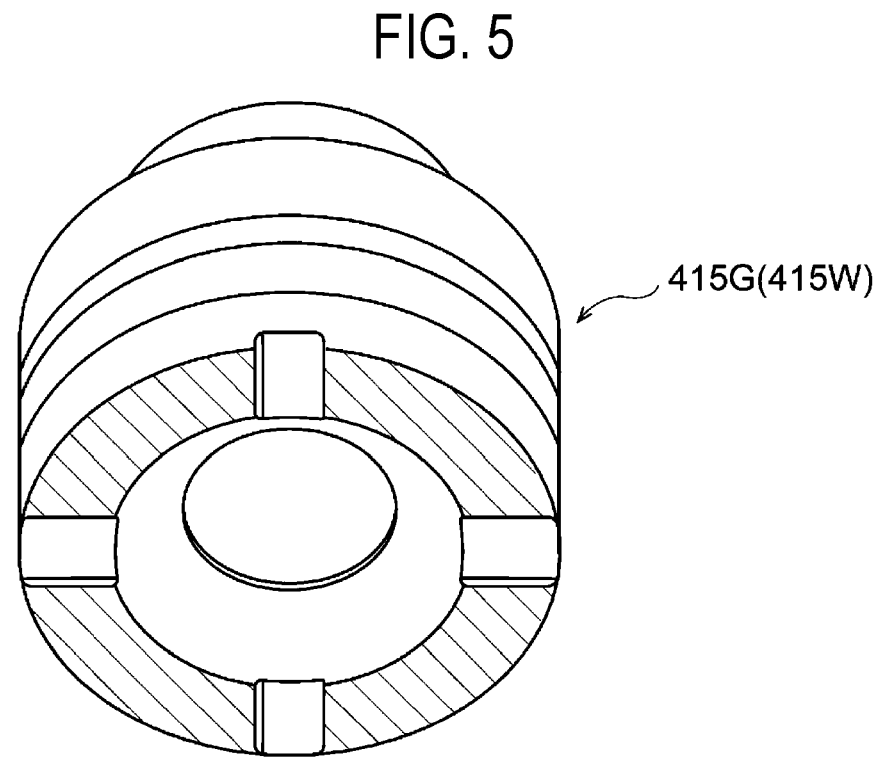
FIG. 5 is a perspective view illustrating a schematic configuration of a brush capable of being used in the brush cleaning unit.

One example of a configuration of the polishing brush 415G is schematically illustrated in FIG. 5. The polishing brush 415G has a configuration in which a polishing sheet carrying abrasive grains is attached to a base made of a PVA sponge. The polishing sheet is attached in a region indicated by hatching in FIG. 5. The cleaning brush 415W has substantially the same configuration as the polishing brush 415G except for not having a polishing sheet. Further, although not illustrated, there is a type of brush called a combination brush, which is a cleaning brush having a function of discharging a cleaning liquid (chemical liquid). These brushes are all well known in the field of semiconductor manufacturing equipment, and thus, detailed illustrations and descriptions are omitted.

The brush cleaning unit 41 further includes a plurality of (here two) nozzle arms 416A and 416B. In one embodiment, a nozzle 417A for selectively discharging one of a cleaning liquid and a rinsing liquid is supported on a tip of one nozzle arm 416A, while a nozzle 417B (two-fluid nozzle) for discharging a two-fluid mixture is supported on a tip of the other nozzle arm 416B. For example, a mixed fluid of mist of a rinsing liquid and nitrogen gas is discharged from the nozzle 417B. Nozzles for discharging other process fluids may also be added.

The nozzle arms 416A and 416B can respectively move the supported nozzles 417A and 417B at any movement speed to any position between home positions (standby positions) outside the cup 413 and the position corresponding to the center of the wafer W held by the spin chuck 412 in a plan view. In the illustrated embodiment, the nozzle arms 416A and 416B are configured to be pivotable around a vertical axis passing through proximal ends of the nozzle arms 416A and 416B by pivoting drives respectively assigned to the nozzle arms 416A and 416B. Lifting mechanisms for raising or lowering the nozzle arms 416A and 416B are attached to the pivoting drives for the nozzle arms 416A and 416B, respectively.

To each nozzle, a required process fluid (a cleaning liquid, a rinsing liquid, nitrogen gas, and the like) is supplied from a process fluid source via a supply line provided with a process fluid supply controller. The process fluid supply controller includes devices such as on-off valves, flow-rate control valves, and flow meters. In FIG. 3, reference numeral 4171 denotes a cleaning liquid source, reference numeral 4172 denotes a rinsing liquid source, reference numeral 4173 denotes a process fluid supply controller for the cleaning liquid, and reference numeral 4174 denotes a process fluid supply controller for the rinsing liquid. Further, reference numeral 4175 denotes a rinsing liquid source, reference numeral 4176 denotes a nitrogen gas source, reference numeral 4177 denotes a process fluid supply controller for the rinsing liquid, and reference numeral 4178 denotes a process fluid supply controller for the nitrogen gas.

Figure 6:
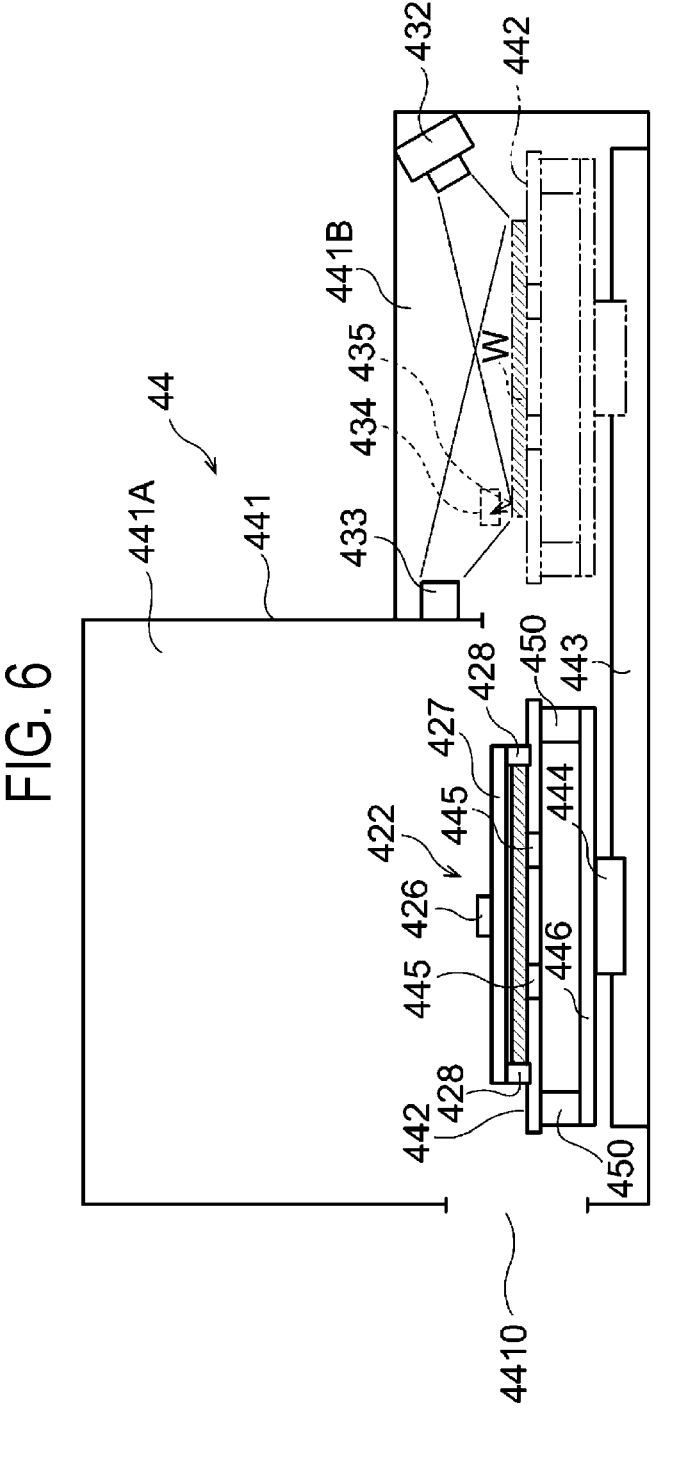
FIG. 6 is a schematic longitudinal-sectional view illustrating an exemplary configuration of a reversal/imaging composite unit capable of being incorporated into the substrate processing system according to the first embodiment.
Figure 7:
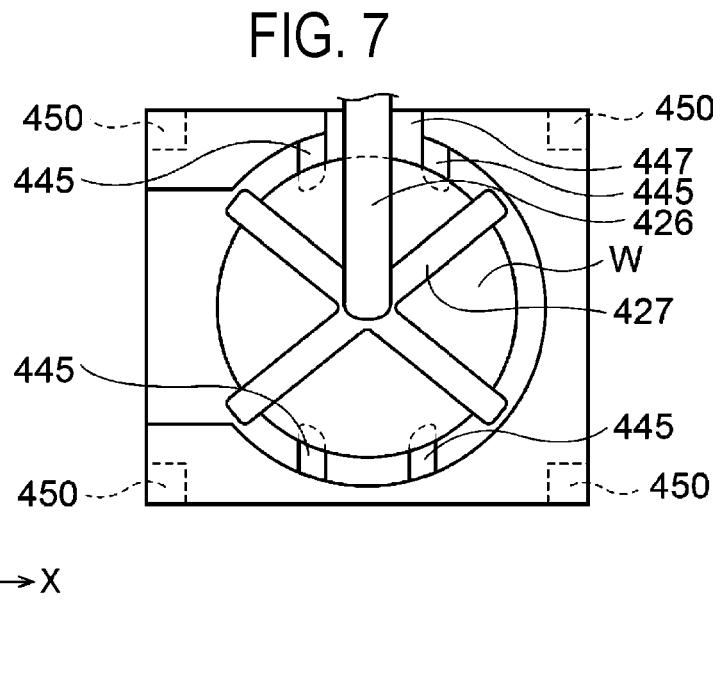
FIG. 7 is a schematic plan view illustrating an example of a relationship between a tray of the reversal/imaging composite unit in FIG. 6 and peripheral components.
Figure 8:
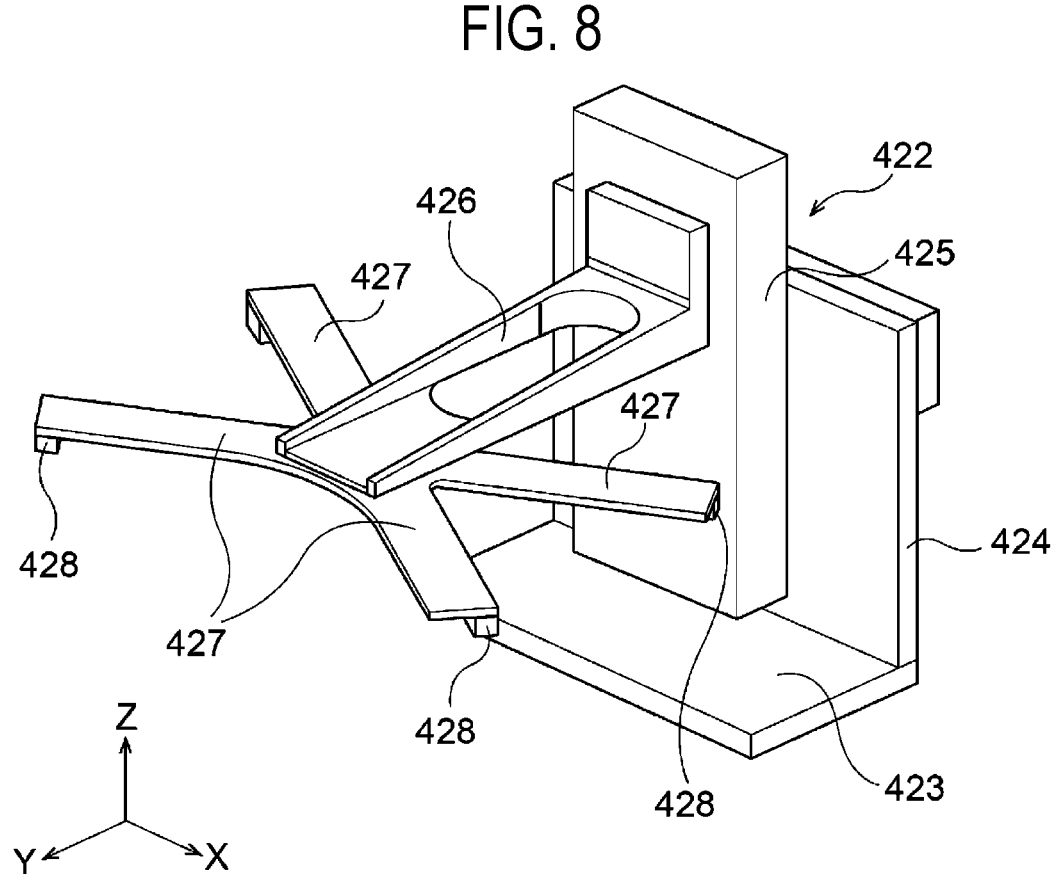
FIG. 8 is a perspective view illustrating an example of a reversal mechanism incorporated into the reversal/imaging composite unit in FIG. 6.

Next, a configuration of the reversal/imaging composite unit 44 will be described with reference to FIGS. 6 to 8. As illustrated in FIG. 6, the reversal/imaging composite unit 44 includes a common housing 441. An interior of the housing 441 has a reversal area 441A and an imaging area 441B.

A tray 442 (substrate support) that moves between a standby position in the reversal area 441A and an imaging position in the imaging area 441B is provided inside the housing 441. In the illustrated embodiment, the tray 442 is held by a base plate (base) 446, which is fixed to a moving body 444 that moves along a guide rail 443. As illustrated in FIGS. 6 and 7, the tray 442 is configured to support the wafer W from below by a plurality of (four in the illustrated example) supporting pieces 445 provided at equal intervals along a circumferential direction of the wafer W.

A reversal mechanism (also referred to as "reverser") 422 is provided in the reversal area 441A. Any appropriate known mechanism in the field of semiconductor manufacturing equipment may be used as the reversal mechanism 422, but one example thereof is illustrated in FIG. 8.

The reversal mechanism 422 includes a column 424 provided on a base 423, a lifting slider 425 that is movable up and down along the column 424, a horizontal arm 426 rotatably installed to the lifting slider 425 via a rotary mechanism (not illustrated), four holding arms 427 provided radially at a tip of the horizontal arm 426, and a movable gripping hook 428 provided at a tip of each holding arm 427.

In addition, among the components of the reversal mechanism 422, only the horizontal arm 426 and the holding arms 427 are illustrated in FIG. 6, in order to prevent the drawing from being complicated.

By moving the four gripping hooks 428 of the reversal mechanism 422 closer to the periphery of the wafer W, it is possible to grip the wafer W supported on the supporting pieces 445 of the tray 442 by the gripping hooks 428. In this state, the wafer W can be lifted upward from the tray 442 by raising the lifting slider 425. Furthermore, in this state, it is possible to flip the wafer W by rotating the horizontal arm 426 around a rotation axis extending in a horizontal direction by 180 degrees. Subsequently, by lowering the lifting slider 425 and releasing the gripping hooks 428, the flipped wafer W can be placed on the supporting pieces 445 of the tray 442. The reversal area 441A has a sufficient dimension in a height direction to enable the above-described flipping operation of the wafer W. The dimension of the reversal area 441A in the height direction is greater than a dimension of the imaging area 441B in the height direction.

To enable the above-described flipping operation of the wafer W, a first cutout 447, which is formed such that the horizontal arm 426 passes through the first cutout 447 in the vertical direction, is provided in the tray 442. Further, a vertical distance between the tray 442 and the base plate 446 is set to be sufficiently large to enable the holding arms 427, which hold the wafer W and have flipped 180 degrees from the state illustrated in FIG. 8, to place the flipped wafer W on the supporting pieces 445 of the tray 442.

In addition, a second cutout 448 is provided in the tray 442. The second cutout 448 enables delivery of the wafer W between the supporting pieces 445 of the tray 442 and a substrate gripping arm 47 (e.g., two-pronged fork-shaped member) serving as an end effector of the second transfer robot 46 that has entered the reversal area 441A from an entrance 4410 of the housing 441. In other words, the substrate gripping arm 47 can be lowered via the second cutout 448 to a height position below the tray 442, and thus the wafer W can be placed on the supporting pieces 445 of the tray 442. Further, by inserting an empty substrate gripping arm 47 into a gap between the tray 442 and the base plate 446 and raising the substrate gripping arm 47, the substrate gripping arm 47 can remove the wafer W from the tray 442.

The tray 442 is connected to the base plate 446 by one or more (e.g., four in the illustrated example) connection columns 450. For example, as illustrated in FIG. 7, the connection columns 450 extend from four corners of a lower surface of the tray 442 toward the base plate 446.

Lift pins (not illustrated) may be additionally provided to assist the delivery of the wafer W between the tray 442 and the reversal mechanism 422 and between the tray 442 and the second transfer robot 46. The lift pins may be provided to support, for example, a periphery (edge exclusion region) of the lower surface of the wafer W, other than portions in contact with the supporting pieces 445 and portions gripped by the gripping hooks 428 of the reversal mechanism 422. By performing the delivery of the wafer W between the second transfer robot 46 and the tray 442 or between the reversal mechanism 422 and the tray 442 via the lift pins, the configuration of the tray 442 can be simplified.

In this case, the second transfer robot 46 (or the reversal mechanism 422) can place the wafer W on the lift pins at a raised position, and thereafter, the wafer W can be placed on the tray 442 by lowering the lift pins. Further, the wafer W placed on the tray 442 can be lifted by the lift pins, and thereafter, the second transfer robot 46 (or the reversal mechanism 422) can remove the wafer W from the lift pins. With this configuration, the tray 442 does not interfere with the delivery of the wafer W.

The delivery of the wafer W via the lift pins is well known in the field of semiconductor manufacturing equipment, and illustrations and detailed descriptions are omitted. In addition, the lift pins and a lifting mechanism thereof may be positioned to avoid interference with the guide rail 443 and the moving body 444.

A camera 432 is provided on or in a vicinity of a rear side wall (a wall on a side far from the reversal area 441A) of the imaging area 441B. The camera 432 is, for example, an area camera, and is configured to be capable of capturing an entire surface of the wafer W, which is placed on the tray 442 at an imaging position, at once.

A lighting device 433 is provided on or in a vicinity of a front side wall (a wall on a side close to the reversal area 441A) of the imaging area 441B, and is configured to be capable of illuminating the entire surface of the wafer W placed on the tray 442 at the imaging position. The lighting device 433 may also be provided on a ceiling wall of the imaging area 441B.

In addition, techniques for inspecting the surface (back surface) of the wafer W using such an area camera are described in patent publications related to prior patent applications by the present applicant (e.g., Japanese Patent Laid-Open Publication No. 2016-157841, Japanese Patent Laid-Open Publication No. 2015-215193, Japanese Patent Laid-Open Publication No. 2014-115140, and Japanese Patent Laid-Open Publication No. 2018-056574, and the like), and the techniques disclosed in these publications can be applied to the imaging technique of the present disclosure.

Instead of the area camera, a line camera (line scan camera) may be used. The line camera may be provided on a side of the imaging area 441B close to the reversal area

441A such that the line camera is positioned adjacent to and immediately above a movement path of the wafer W placed on the tray 442, for example, as schematically represented by a dashed rectangle with reference numeral 434. One or more reflectors may be provided to guide image light to the line camera 434. With this configuration, a degree of freedom in the installation position of the line camera 434 can be improved.

When using the line camera 434, a line light (linear illumination) may be used as a lighting device. Such a line light may be provided alongside the line camera 434, for example, as schematically represented by a dashed rectangle with reference numeral 435. Two line lights 435 may be provided on both sides of the line camera 434, and illumination light may be projected from these line lights toward a linear imaging area.

With the above-described configuration using the line camera, it is possible to scan the entire back surface of the wafer W by the line camera 434 when moving the tray 442 on which the wafer W is placed. Therefore, it is not necessary to provide a movement mechanism solely for scanning. Further, since imaging is performed during the movement of the wafer W, it is possible to reduce a time required to inspect the wafer W.

<Description of Flow of Wafer W>

Next, a flow of transferring and processing one sheet of wafer W will be described.

In the container F on the stage section 21 of the substrate loading/unloading block 20, a plurality of wafers W is accommodated with a front surface (surface where devices are formed (first surface)) of each wafer W facing upward. The first transfer robot 23 takes out one sheet of wafer W from the container F and loads the wafer W into the buffer unit 31 of the interface block 30. The vertical transfer robot 33 then takes out the wafer W from the buffer unit 31 and loads the wafer W into the delivery unit 32.

The second transfer robot 46 takes out the wafer W from the delivery unit 32 and loads the wafer W into the reversal area 441A of the reversal/imaging composite unit 44, which is dedicated for pre-cleaning inspection only. The second transfer robot 46 places the wafer W on the tray 442.

Subsequently, the holding arms 427 of the reversal mechanism 422 grip and lift the wafer W on the tray 442, and flip the wafer W so that the back surface (surface where devices are not formed (second surface)) of the wafer W becomes an upper surface. Thereafter, the holding arms 427 are lowered to place the wafer on the tray 442.

Subsequently, the tray 442 on which the wafer W is placed is moved into the imaging area 441B. When the tray 442 on which the wafer W is placed is stopped at a predetermined position in the imaging area 441B, the camera 432 captures an image of the back surface of the wafer W. Image data acquired by the camera 432 is sent to the control device 100. The control device 100 performs image analysis to inspect defects, such as flaws, foreign substances, and particles, on the back surface of the wafer W (pre-cleaning inspection). Through this pre-cleaning inspection, it is possible to recognize the number, size, shape, and the like of defects on the back surface (surface to be processed) of the wafer W before processing.

In addition, in the image analysis, a position of a notch on the wafer W may be detected from the image to create a map illustrating distribution of defects on the wafer W in association with the position of the notch. Alternatively, a notch aligner may be incorporated into the reversal/imaging composite unit 44. In this case, the wafer W is imaged in a state where the notch is positioned in a specific direction.

In a case where the line camera 434 is provided, when the tray 442 on which the wafer W is placed moves from the reversal area 441A to the imaging area 441B, the back surface of the wafer W is scanned and imaged using the movement of the tray 442, and thus the entire back surface of the wafer W is imaged. The back surface of the wafer W may be scanned and imaged when the tray 442 on which the wafer W is placed returns from the imaging area 441B to the reversal area 441A.

In another embodiment, the line camera 434 and the line light 435 may be provided adjacent to and directly below the movement path of the wafer W placed on the tray 442. In this case, the wafer W loaded into the reversal area 441A of the reversal/imaging composite unit 44 is moved to the imaging area 441B without being flipped, and after completion of the inspection, the wafer W is flipped in the reversal area 441A and then unloaded by the second transfer robot 46. In addition, in this case, the line camera 434 and the line light 435 are provided so as not to collide with the moving tray 442. Specifically, for example, a configuration in which the number of connection columns 450 is reduced and the connection columns 450 are provided only on the lower side in FIG. 7, and a configuration in which the line camera 434 and the line light 435 are supported by a cantilever support extending from the rear side of the imaging area 441B toward the reversal area 441A, and the like are conceivable.

In addition, techniques for inspecting a downward-facing surface of a substrate, which is moved while being placed on a substrate stage, by imaging the downward-facing surface of the substrate are disclosed in prior patent application publications by the present applicant (e.g., Japanese Patent Laid-Open Publication No. 2014-109436, and the like), and the techniques disclosed in these publications can be applied to the imaging technique of the present disclosure. Further, techniques for inspecting a downward-facing surface of a substrate by imaging the downward-facing surface of the substrate by an imaging unit that moves below the substrate are disclosed in prior patent application publications by the present applicant (e.g., Japanese Patent Laid-Open Publication No. 2013-137292, and the like), and the techniques disclosed in these publications can be applied to the imaging technique of the present disclosure.

After completion of imaging the wafer W before processing, the tray 442 on which the wafer W is placed is returned to the reversal area 441A. The second transfer robot 46 enters the reversal area 441A, grips the wafer W on the tray 442, and retreats from the reversal/imaging composite unit 44.

The second transfer robot 46 loads the wafer W, with the back surface of the wafer W facing upward, into the brush cleaning unit 41. The wafer W is held by the spin chuck 412.

An example of processes performed in the brush cleaning unit 41 will be briefly described. First, rotation of the wafer W is started. Subsequently, the polishing brush 415G is pressed against the back surface of the rotating wafer W, and is moved along a radial direction of the wafer W. The brush 415G may reciprocate between the center and the periphery of the wafer W one or more times along the radial direction of the wafer W. Thus, relatively large defects (e.g., foreign substances, adherents, and the like) present on the back surface of the wafer W are removed (brush polishing process).

Subsequently, while supplying a first cleaning liquid from a nozzle to the center of the back surface of the wafer W that continues to rotate, the cleaning brush 415W is pressed against the back surface of the rotating wafer W, and is moved along the radial direction of the wafer W. The brush

415W may reciprocate between the center and the periphery of the wafer W one or more times along the radial direction of the wafer W. Thus, foreign substances such as polishing debris and particles adhering to the back surface of the wafer W are removed (brush cleaning process).

Subsequently, a two-fluid mixture (a mixed fluid of mist of a second cleaning liquid and an inert gas such as nitrogen gas) is supplied from a two-fluid nozzle to the back surface of the wafer W that continues to rotate. At this time, the two-fluid mixture is discharged from the two-fluid nozzle while moving the two-fluid nozzle so that a collision point where the two-fluid mixture collides with the back surface of the wafer W moves between the center and the periphery of the wafer W. Thus, foreign substances (e.g., particles), which were not removed by the brush polishing process and the brush cleaning process, are removed from the back surface of the wafer W (two-fluid mixture cleaning process).

Subsequently, a rinsing liquid (e.g., DIW) is supplied from a nozzle to the center of the back surface of the wafer W that continues to rotate. Thus, residues derived from the cleaning liquid, fine particles, and the like, which remain on the back surface of the wafer W, are rinsed away (rinsing process).

Subsequently, the supply of the liquid to the wafer W is stopped, and by continuing to rotate the wafer W (particularly, increasing a rotation speed), the liquid remaining on the surface of the wafer W is shaken off and the surface of the wafer W is dried (shake-off drying process).

As described above, the processes for the wafer W in the brush cleaning unit 41 are completed.

Next, the second transfer robot 46 takes out the wafer W from the brush cleaning unit 41 and loads the wafer W into the reversal area 441A of the reversal/imaging composite unit 44, which is dedicated for post-cleaning inspection only. The second transfer robot 46 places the wafer W on the tray 442.

Subsequently, the tray 442 on which the wafer W is placed with the back surface of the wafer W facing upward is moved into the imaging area 441B. Inside the imaging area 441B, post-cleaning imaging is performed, similar to the pre-cleaning imaging. Further, similar to the pre-cleaning inspection, the control device 100 inspects defects on the back surface of the wafer W by image analysis (post-cleaning inspection).

After completion of the post-cleaning inspection, the tray 442 on which the wafer W is placed is returned to the reversal area 441A. Thereafter, following the same sequence as described above, the reversal mechanism 422 flips the wafer W so that the surface (surface where devices are formed) of the wafer W faces upward, and then places the wafer W on the tray 442.

Subsequently, the second transfer robot 46 enters the reversal area 441A, grips the wafer W on the tray 442, and retreats from the reversal/imaging composite unit 44. The second transfer robot 46 loads the wafer W into the delivery unit 32. The vertical transfer robot 33 then takes out the wafer W from the delivery unit 32 and loads the wafer W into the buffer unit 31.

The first transfer robot 23 takes out the wafer W from the buffer unit 31 and loads the wafer W into the container F on the stage section 21 of the substrate loading/unloading block 20.

As described above, a series of transferring and processing the wafer W in the substrate processing system 1 is completed.

The control device 100 is configured to determine whether or not it is necessary to change process conditions in the brush polishing process and the brush cleaning process (e.g., a rotation speed of the wafer, a pressing pressure of the brush, a scanning speed (movement speed in the radial direction) of the brush, a reciprocation number of brush, a process time, and the like) based on the results of the pre-cleaning inspection (pre-processing imaging) and/or the post-cleaning inspection (post-processing imaging), and when it is determined that a change is necessary, change the process conditions according to predetermined rules. The following description is an example of a flow of changing the process conditions performed by the control device 100. In addition, in the following example, flaws (marks, scratches, and the like), jammed foreign substances, and the like (hereinafter simply referred to as "flaws" for simplification in the description) are taken as examples of defects present on the back surface of the wafer W.

The control device 100 determines the wafer W as failed when a state of the back surface of the wafer W after the cleaning process in the brush cleaning unit 41 does not meet a predetermined criterion (e.g., when an unacceptable size or number of flaws are present). The wafer W determined as failed may be transferred to, for example, the buffer unit 31, temporarily stored in the buffer unit 31, and then processed again.

When the wafer W determined as failed is generated, it is determined whether or not it is necessary to review the processing recipe.

A cause of the failed wafer W may include insufficient removal of flaws that existed before processing (e.g., by brush polishing) or formation of new flaws by brush polishing.

To determine the cause of failure, a comparison between a result of the pre-cleaning inspection and a result of the post-cleaning inspection (e.g., calculation of a difference between image data obtained by the pre-cleaning inspection and image data obtained by the post-cleaning inspection) is performed.

A first case of changes before and after cleaning will be described. It is assumed that uneven (irregular) flaws that existed before cleaning have changed into concentric flaws. In this case, it is determined that although the original flaws could be removed by brush polishing, new flaws were generated by the brush polishing. It is known that concentric polishing flaws that may be generated during the brush polishing process can be reduced by (a) increasing a scan speed of the brush, (b) decreasing a rotation speed of the wafer W, or (c) increasing a pressing pressure of the brush. Thus, it is conceivable to change process conditions of the brush polishing by performing at least one of (a), (b), or (c).

In this case, according to a status of concentric polishing flaws, modified process conditions of the brush polishing, which can reduce the polishing flaws, may be obtained in advance through experiments and stored in a database of the control device 100. Then, based on the result of the post-cleaning inspection, the control device 100 may select optimal process conditions with reference to the database and perform brush polishing on a next wafer W to be processed by using the selected process conditions.

In addition, since the processing recipe is created based on results of preliminary processing experiments, a probability that a failed wafer W is generated due to inappropriate process conditions of brush polishing is relatively low, but there is a possibility that the failed wafer W is generated due to some irregularities (e.g., occurrence of a problem in the polishing brush). Therefore, when one sheet of failed wafer W is generated, the control device 100 may generate a notification prompting an operator to inspect the polishing brush via a user interface (display, and the like).

Alternatively, the process conditions of brush polishing may be changed immediately when one sheet of failed wafer W is generated. Alternatively, the process conditions of brush polishing may be changed when predetermined two or more sheets of failed wafers W are generated consecutively.

A second case of changes before and after cleaning will be described. It is assumed that sizes (magnitudes, depths, and the like) of uneven (irregular) flaws that existed before cleaning have been reduced by cleaning, but are still beyond acceptable ranges. In addition, it is assumed that there are no concentric flaws at a problematic level.

In this case, it is conceivable that potential causes may be excessively large sizes of flaws that existed before cleaning, wear of the brush, and the like.

When it is confirmed that, by referring to data from a result of pre-cleaning inspection of a failed wafer W, sizes of flaws that existed on the wafer W before cleaning are excessively large, it may be determined not to change process conditions of brush polishing for a next wafer W to be processed.

In addition, when it is confirmed, during pre-cleaning inspection, that sizes of flaws present on a wafer W are excessively large, processing the wafer W may be stopped, or process conditions of brush polishing may be changed (e.g., a brush polishing time or a reciprocation number of the brush may be increased) with respect to the wafer W only to process the wafer W.

When the wafer W after cleaning is failed though sizes of flaws that existed before the cleaning are not large, it is determined that, by referring to data from a result of pre-cleaning inspection, wear of the brush is the cause of the failed wafer W. In this case, the control device 100 may generate a notification prompting the operator to replace the polishing brush via the user interface (a display, and the like). Instead of this, process conditions of brush polishing on a next wafer W to be processed may be changed to increase the brush polishing time.

In addition, comparison data between a result of pre-cleaning inspection and a result of post-cleaning inspection for each of a plurality of wafers W processed consecutively in one brush cleaning unit 41 may be accumulated to recognize, based on the accumulated data, a temporal change in a state of wear of the brush. Conditions of brush polishing may be gradually changed based on data on the temporal change in the state of wear of the brush.

Further, each wafer W may be processed by modifying process conditions of brush polishing for the wafer W based on a result of pre-cleaning inspection for the wafer W. In this case, optimal brush polishing conditions according to, for example, sizes and types of flaws may be obtained in advance through experiments and stored in the database of the control device 100. The control device 100 may select, with reference to the database, optimal process conditions based on the result of pre-cleaning inspection to perform brush polishing on the wafer W. In this case, the result of post-cleaning inspection for the wafer W may be used not only for determining pass or failure of the wafer W but also for checking validity of modifying the process conditions, and may also be helpful in brushing up the database.

In addition, although only modifying process conditions of brush polishing has been described above, the present disclosure is not limited thereto, and data on pre-processing inspection and post-processing inspection may also be used to determine whether or not it is necessary to change process conditions of two-fluid mixture cleaning (such as a scan speed of the two-fluid nozzle, flow rates of the second cleaning liquid and the inert gas, and the like).

According to the above-described embodiment, during a period in which one sheet of wafer W is taken out from the container F, processed, and returned again to the container F, pre-processing inspection and post-processing inspection by imaging the one sheet of wafer W are performed. Based on the result of post-processing inspection, it is determined whether or not the processed wafer F is a good product. In addition, based on at least one of the pre-processing inspection or the post-processing inspection, process conditions of brush processing for the wafer W subjected to the pre-processing inspection or for a wafer W (substrate) to be processed afterward (e.g., a next wafer W) are changed. Therefore, it is possible to significantly reduce a possibility of processing the wafer W under unreasonable process conditions, and to improve a processing yield. Although a wafer W determined to be a bad product (failed) may be relieved by re-processing (e.g., re-polishing), it is beneficial to suppress generation of wafers W that require to be re-processed.

Figure 9:
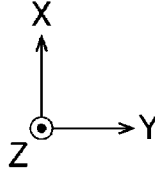
FIG. 9 is a schematic cross-sectional view of a substrate processing system according to a second embodiment of a substrate processing apparatus.
Figure 10:
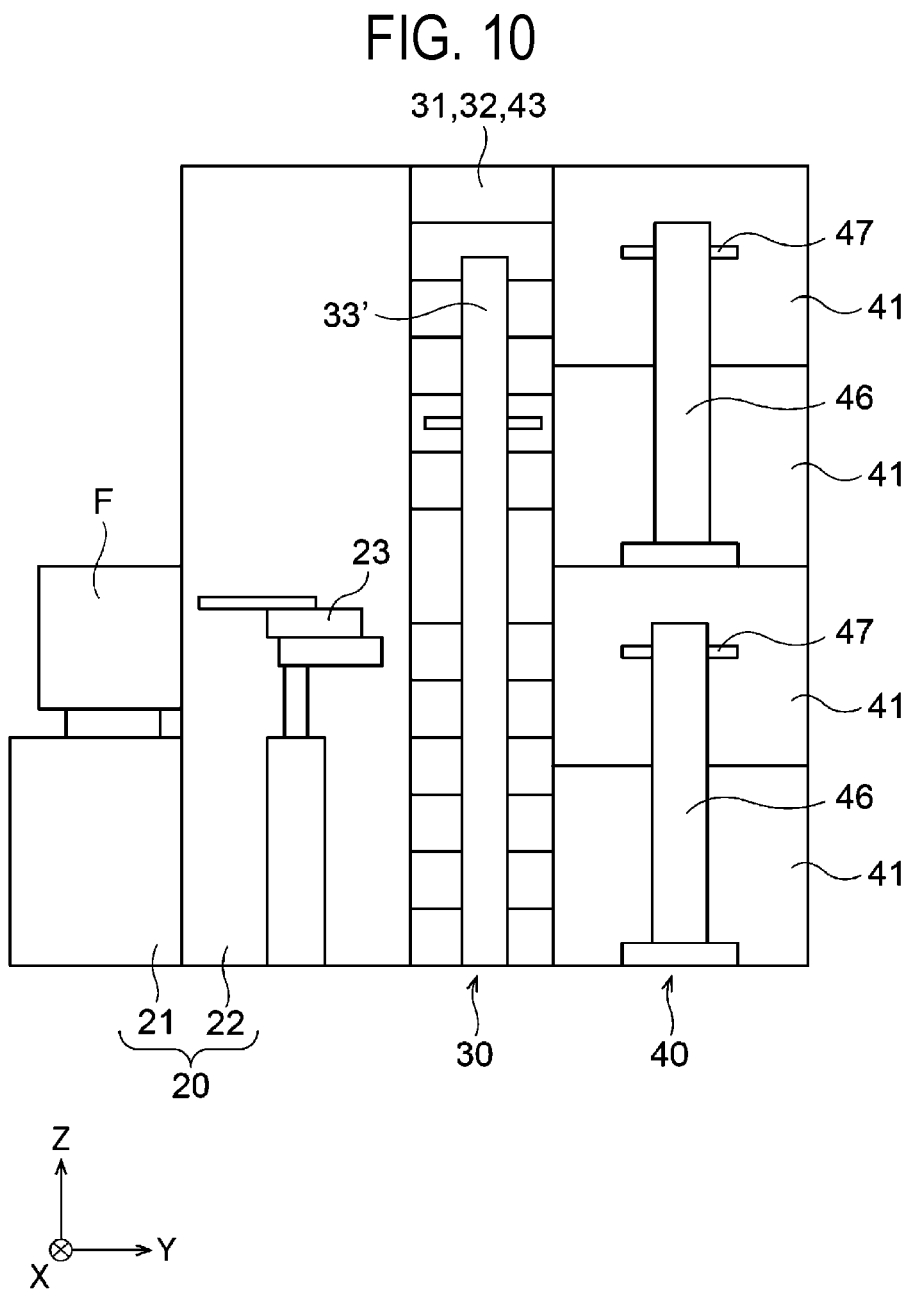
FIG. 10 is a schematic longitudinal-sectional view of the substrate processing system illustrated in FIG. 9.

Next, another embodiment (hereinafter referred to as "second embodiment") will be described with reference to FIGS. 9 and 10. The second embodiment differs from the above-described embodiment (hereinafter referred to as "first embodiment") in the following points.

(1) Instead of the reversal/imaging composite unit 44, the reversal unit 42 and the imaging unit 43, which are separated from each other, are provided. Therefore, the horizontally movable tray 442, which was provided in the reversal/ imaging composite unit 44, does not exist. Instead, a wafer stage is provided in each of the reversal unit 42 and the imaging unit 43. The wafer stage supports an edge exclusion region of the wafer W from below.

(2) The reversal unit 42 and imaging unit 43 are provided in the interface block 30.

(3) The reversal unit 42 is stacked together with the buffer unit 31 and delivery unit 32 at the same horizontal position as the buffer unit 31 and delivery unit 32.

(4) The delivery of the wafer W between the reversal unit 42 and the imaging unit 43 is performed via a vertical transfer robot 33'. Therefore, the vertical transfer robot 33' includes, in addition to the lifting body movable in the Z direction and the substrate gripping arm serving as an end effector provided on the lifting body so as to be movable back and forth in the Y direction, a rotary mechanism that rotates the lifting body in a 0 direction (rotates the lifting body around the Z axis).

The second embodiment is the same as the first embodiment except for the points (1) to (4) described above.

Next, focusing on the differences from the first embodiment, a flow of a wafer in the second embodiment will be briefly described.

The first transfer robot 23 takes out one sheet of wafer W from the container F on the stage section 21 of the substrate loading/unloading block 20 and loads the wafer F into the buffer unit 31 for wafers before processing in the interface block 30. The vertical transfer robot 33' takes out the wafer W from the buffer unit 31 and transfers the wafer W to the reversal unit 42 for wafers before processing. The reversal unit 42 flips the wafer W.

Subsequently, the vertical transfer robot 33' transfers the flipped wafer W to the imaging unit 43 for wafers before processing. The imaging unit 43 captures an image of the back surface of the wafer W, and the control device 100 inspects a status of the back surface of the wafer W based on the image data (pre-processing inspection).

Subsequently, the vertical transfer robot 33' transfers the wafer W to the delivery unit 32 for wafers before processing. In the second embodiment, the delivery unit 32 is configured to support a periphery of the front surface (edge exclusion region) of the wafer W.

Subsequently, the second transfer robot 46 takes out the wafer W from the delivery unit 32 and loads the wafer W into the brush cleaning unit 41. In the brush cleaning unit 41, the same processing as that described in the first embodiment is performed.

Subsequently, the second transfer robot 46 takes out the wafer W from the brush cleaning unit 41 and loads the wafer W into the delivery unit 32 for wafers after processing.

Subsequently, the vertical transfer robot 33' takes out the wafer W from the delivery unit 32 and transfers the wafer W to the imaging unit 43 for wafers after processing. The imaging unit 43 captures an image of the back surface of the wafer W, and the control device 100 inspects a status of the back surface of the wafer W based on the image data (post-processing inspection).

Subsequently, the vertical transfer robot 33' transfers the wafer W to the reversal unit 42 for wafers after processing. The reversal unit 42 flips the wafer W so that the front surface (surface where devices are formed) of the wafer W faces upward.

Subsequently, the vertical transfer robot 33 transfers the wafer W from the reversal unit 42 to the buffer unit 31 for wafers after processing.

Subsequently, the first transfer robot 23 takes out the wafer W from the buffer unit 31 and loads the wafer W into the container F on the stage section 21 of the substrate loading/unloading block 20.

As described above, a series of transferring and processing the wafer W in the substrate processing system 1 is completed.

In the second embodiment, the same effects as those in the first embodiment can also be obtained.

According to the embodiments of the present disclosure described above, it is possible to automatically optimize conditions of brush cleaning.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a container loading/unloading section on which a container, which accommodates a plurality of substrates each with a first surface facing upward and a second surface facing downward, is placed;
   a brush processing section configured to perform brush processing for polishing or removing foreign substances on the second surface of the each of the substrates by using a brush;
   a substrate reversal section configured to flip a first substrate that is taken out from the container, among the plurality of substrates, to face the second surface upward before the first substrate is processed in the brush processing section, and configured to flip the first substrate to face the first surface upward after the first substrate is processed in the brush processing section and before the first substrate is returned to the container;

a substrate imaging section configured to perform pre-processing imaging on the second surface of the first substrate that is taken out from the container before the first substrate is processed in the brush processing section, and configured to perform post-processing imaging on the second surface of the first substrate after the first substrate is processed in the brush processing section and before the first substrate is returned to the container; and a controller;

wherein the controller is configured to determine whether or not the first substrate after the brush processing is a defective product based on a result of the post-processing imaging, and further configured to determine whether to change a process condition of the brush processing in the brush processing section for the first substrate or a second substrate to be processed based on at least one of the pre-processing imaging or the post-processing imaging, wherein the brush processing section includes:

a substrate holding rotator configured to hold and rotate the first substrate with the second surface of the first substrate facing upward; and a brush drive having a rotator configured to rotate the brush for polishing or removing foreign substances, a presser configured to press the brush against the second surface of the first substrate held by the substrate holding rotator, and a horizontal mover configured to horizontally move the brush on the second surface of the first substrate, and wherein the controller is further configured to change, when it is determined to change the process condition of the brush processing, at least one parameter selected from the group consisting of:

a rotation speed of a substrate by the substrate holding rotator;

a pressing pressure of the brush against a substrate by the presser of the brush drive; and a movement speed of the brush by the horizontal mover of the brush drive.

2. The substrate processing apparatus of claim 1, wherein the controller is further configured to determine the first substrate as defective when a state of the second surface of the first substrate after being processed by the brush processing section fails to meet a predetermined criterion, the state being obtained based on the post-processing imaging.

3. The substrate processing apparatus of claim 2, wherein the controller is further configured to change the process condition of the brush processing in the brush processing section after a predetermined number of substrates are determined as defective.

4. The substrate processing apparatus of claim 1, wherein the controller is further configured to determine whether or not to change the process condition of the brush processing in the brush processing section or whether or not to replace the brush, based on a comparison result between the pre-processing imaging and the post-processing imaging for the first substrate after being processed by the brush processing section.

5. The substrate processing apparatus of claim 1, wherein the controller is further configured to be able to change the process condition of the brush processing in the brush processing section for the first substrate based on a result of the pre-processing imaging.

6. The substrate processing apparatus of claim 1, wherein the substrate reversal section and the substrate imaging section are integrated to constitute a single substrate reversal inspection section, and wherein the substrate reversal inspection section includes a substrate horizontal transporter configured to horizontally transfer the first substrate between the substrate reversal section and the substrate imaging section inside the substrate reversal inspection section.

7. The substrate processing apparatus of claim 6, wherein the substrate imaging section includes a line camera as an imaging device, and is configured to perform scan-imaging on the second surface of the first substrate by horizontally moving the first substrate by the substrate horizontal transporter.

8. The substrate processing apparatus of claim 1, wherein a plurality of substrate reversal sections is provided, and the plurality of substrate reversal sections includes a first substrate reversal section configured to flip the first substrate before being processed in the brush processing section and a second substrate reversal section configured to flip the first substrate after being processed in the brush processing section, and wherein a plurality of substrate imaging sections is provided, and the plurality of substrate imaging sections includes a first substrate imaging section configured to image the first substrate before being processed in the brush processing section and a second substrate imaging section configured to image the first substrate after being processed in the brush processing section.

9. The substrate processing apparatus of claim 8, wherein the first substrate reversal section and the first substrate imaging section are integrated to constitute a single first substrate reversal imaging section, wherein the first substrate reversal imaging section includes a first substrate horizontal transporter configured to horizontally transfer the first substrate between the first substrate reversal section and the first substrate imaging section inside that first substrate reversal imaging section, wherein the second substrate reversal section and the second substrate imaging section are integrated to constitute a single second substrate reversal imaging section, and wherein the second substrate reversal imaging section includes a second substrate horizontal transporter configured to horizontally transfer the first substrate between the second substrate reversal section and the second substrate imaging section inside that second substrate reversal imaging section.

10. A substrate processing method using a substrate processing apparatus, wherein the substrate processing apparatus comprises:

a container loading/unloading section on which a container, which accommodates a plurality of substrates each with a first surface facing upward and a second surface facing downward, is placed;

a brush processing section configured to perform brush processing for polishing or removing foreign substances on the second surface of each of the substrates by using a brush;

a substrate reversal section configured to flip a first substrate that is taken out from the container, among the plurality of substrates, to face the second surface upward before the first substrate is processed in the brush processing section, and configured to flip the first substrate to face the first surface upward after the first substrate is processed in the brush processing section and before the first substrate is returned to the container; and a substrate imaging section configured to perform preprocessing imaging on the second surface of the first substrate that is taken out from the container before the first substrate is processed in the brush processing section, and configured to perform post-processing imaging on the second surface of the first substrate after the first substrate is processed in the brush processing section and before the first substrate is returned to the container, wherein the substrate processing method comprises:

performing, by the substrate imaging section, the pre-processing imaging on the second surface of the first substrate that is taken out from the container before the first substrate is processed in the brush processing section;

performing, by the brush processing section, the brush processing on the first substrate after the pre-processing imaging;

performing, by the substrate imaging section, the post-processing imaging on the second surface of the first substrate after the first substrate is processed in the brush processing section and before the first substrate is returned to the container;

determining whether or not the first substrate after the brush processing is a defective product based on a result of the post-processing imaging; and determining whether to change a process condition of the brush processing in the brush processing section for the first substate or a second substrate to be processed based on at least one of the pre-processing imaging or the post-processing imaging, wherein the brush processing section includes:

a substrate holding rotator configured to hold and rotate the first substrate with the second surface of the first substrate facing upward; and a brush drive having a rotator configured to rotate the brush for polishing or removing foreign substances, a presser configured to press the brush against the second surface of the first substrate held by the substrate holding rotator, and a horizontal mover configured to horizontally move the brush on the second surface of the first substrate, and wherein when it is determined to change the process condition of the brush processing, at least one parameter is changed, the at least one parameter selected from the group consisting of:

a rotation speed of a substrate by the substrate holding rotator;

a pressing pressure of the brush against a substrate by the presser of the brush drive; and a movement speed of the brush by the horizontal mover of the brush drive.

11. The substrate processing method of claim 10, further comprising determining the first substrate as defective when a state of the second surface of the first substrate after being processed by the brush processing section fails to meet a predetermined criterion, the state being obtained based on the post-processing imaging.

12. The substrate processing method of claim 11, wherein the process condition of the brush processing in the brush processing section is changed after a predetermined number of substrates are determined as defective.

13. The substrate processing method of claim 10, wherein whether or not to change the process condition of the brush processing in the brush processing section or whether or not to replace the brush is determined based on a comparison result between the pre-processing imaging and the post-processing imaging for the first substrate after being processed by the brush processing section.

14. The substrate processing method of claim 10, wherein the process condition of the brush processing in the brush processing section for the first substrate is changed based on a result of the pre-processing imaging.

* * * * *